United States Patent [19]

Allmon et al.

[11] 3,848,251

[45] Nov. 12, 1974

[54] LOGICAL CIRCUITRY FOR RECOVERING RPM DECODED PRM RECORDED DATA

[75] Inventors: Dwight George Allmon; Pedro Lee, both of San Jose; Charles Walter Coker, Jr,, Los Gatos, all of Calif.

[73] Assignee: International Business Machines Corporation, Armonk, N.Y.

[22] Filed: July 2, 1973

[21] Appl. No.: 376,032

[52] U.S. Cl. .......... 340/347 DD

[51] Int. Cl. .......... H04l 3/00

[58] Field of Search .......... 340/347 DD, 174.1 G; 178/66, 67, 68; 332/1, 9, 11

[56] References Cited

UNITED STATES PATENTS

| | | | |
|---|---|---|---|
| 3,422,425 | 1/1969 | Vallee | 340/347 DD |
| 3,488,662 | 1/1970 | Vallee | 340/347 DD X |
| 3,623,041 | 11/1971 | MacDougall, Jr. | 340/347 DD |
| 3,678,503 | 7/1972 | Sollman | 340/347 DD |
| 3,689,913 | 9/1972 | Newcomb | 340/347 DD |

*Primary Examiner*—Charles D. Miller
*Attorney, Agent, or Firm*—G. E. Roush

[57] ABSTRACT

The advantages of Retrospective Pulse Modulation (RPM) decoding circuitry obtain as well for decoding information recorded in accordance with Pulse Rate Modulation (PRM) with this translating logical circuitry. Strobe pulse converting subcircuitry is arranged for detecting RPM impulses coinciding with PRM strobe impulses and inhibiting all other RPM Decoded (RPMD) strobe impulses. Other subcircuitry is arranged for translating RPMD data resulting from RPM scanning coding into (true) decoded PRM data. The subcircuits are integrated to take advantage of the inherent characteristics of the two codes for achieving the simplest circuit arrangements. A few conventional latching and gating circuits suffice for many applications. Further subcircuitry is arranged for automatically switching the translating logical circuitry for selectively decoding PRM and RPM coding without requiring the operator's attention.

18 Claims, 12 Drawing Figures

LOGICAL CIRCUITRY FOR RECOVERING RPM DECODED PRM RECORDED DATA

The invention relates to electronic logical circuitry for translating one form of pulse code modulation to another, and it particularly pertains to the translation of pulse rate modulation (PRM) coding as decoded by circuitry arranged in accordance with the principles of retrospective pulse rate modulation (PRM) decoding for obtaining true PRM data. The circuitry described hereinafter relates particularly to that form of pulse rate modulation widely known as "double frequency" and as "F2F" modulation; but the principles of the invention will be readily applied in translating other codes of similar logical form.

Pulse rate modulation and systems employing PRM are extensively used. U.S. Pats. No. 2,853,357 to Alfred W. Barber and 3,217,329 to Andrew Gabor show and describe magnetic recording systems, for example, using pulse rate modulation having a ratio of 2:1 for differentiating data on a binary basis. While other ratios have been used, the 2:1 ratio is by far the most common. The inherent binary characteristics of 2:1 ratio PRM permit fewer and simpler electronic subcircuits in the implementation of PRM systems.

Basically, a PRM wave comprises two (or more) component waves harmonically related one to the other(s). This harmonic relationship distinguishes PRM as special cases of Pulse Position Modulation or Pulse Phase Modulation. Usually the component wave of longer period (or lower frequency) is the base "timing" wave; and the component wave of shorter period and higher frequency is the modulating wave, although this assignment is not at all fixed. One such (binary) PRM wave is commonly known as F2F because the modulating wave is twice the frequency of the "timing" wave.

An example of F2F coding comprises a train of pulses spaced apart at substantially uniform intervals which can be sensed for recovering timing data, and other pulses interposed midway between these timing pulses for representing data of one nature, for example, a binary unit 1. The absence of such a unit pulse between the timing pulses is then interpreted as a binary naught $\phi$. In magnetic recording, each pulse is represented by a reversal or transition of magnetic flux. Thus, the transitions of a series of binary units appear as a square wave of twice the frequency as the transitions of a series of binary naughts; hence, F and 2F, or F2F.

The prior art systems, for the most part at least, are concerned with substantially constant spacing or constant frequency PRM. The co-pending U.S. Pat. application, Ser. No. 287,132, of William Arnold Boothroyd, filed on the 7th day of Sept., 1972, for "Demodulating Circuitry for Pulse Rate Modulation Data Reproduction" describes F2F systems and apparatus for decoding, especially designed for scanning, at a not necessarily constant, but smoothly (that is, not abruptly) varying rate. Examples of circuitry for these arrangements that are considered to be helpful in the practice of systems according to the invention are to be found in the following U.S. Patents:

| | | | |
|---|---|---|---|
| 3,374,475 | 03/1968 | Gabor | 340-174.1 |
| 3,404,391 | 10/1968 | Chur | 340-174.1 |
| 3,405,391 | 10/1968 | Halfhill et al. | 340-167 |
| 3,467,955 | 09/1969 | Poumakis | 340-174.1 |

-Continued

| | | | |
|---|---|---|---|
| 3,510,780 | 05/1970 | Buehrle | 325-321 |
| 3,541,706 | 05/1970 | Dupraz et al. | 328-164 |
| 3,518,648 | 06/1970 | Norris | 340-174.1 |
| 3,623,074 | 11/1971 | Bailey | 347-347 DD |

and in the technical literature:

IBM Technical Disclosure Bulletin, Vol. 13, No. 8, Jan. 1971, p. 2,274, "Generation of Data Transition Pulses from Phase-Encoded Data" of R. Andersen and F. W. Niccone; and p. 2,449, "Double Frequency Data/Clock Separator," A. F. Schwilk.

IBM Technical Disclosure Bulletin, Vol. 13, No. 10, March 1971, p. 3,055, "Demodulator," G. L. Dix.

Retrospective pulse modulation (RPM) is of more recent origin. This form of modulation is described in U.S. Pat. No. 3,708,748, of Ernie George Nassimbene, issued the 2nd day of Jan., 1973, based on an application filed on Apr. 27, 1970, for "Retrospective Pulse Modulation and Apparatus Therefor." In RPM, a series of manifestations, such as impulses corresponding to leading or trailing edges or transitions of pulses, are arranged in succession by differing spaces therebetween in accordance with the data. In one arrangement useful in accordance with the invention, binary data comprises naughts ($\phi$) and units 1 represented by a series of impulses spaced in succession as the data is arranged. For example, a start impulse is generated and at a given time interval thereafter, an initial reference impulse is generated. In a binary character, for example, the binary unit or 1 is thereafter manifested by an impulse spaced substantially at the same interval as between the initial and reference impulses. A binary naught, or $\phi$, is then denoted by an interval different from the spacing between the preceding pulses. Preferably, the different spacing is of the order of 2:1; for example, a binary unit may be manifested by three impulses in series with equidistant spacing between the succeeding impulses and a binary naught then would be manifested by three impulses with spacing between two impulses twice as great as that between one of the previous impulses and the succeeding impulse. After the start and reference impulses, decoding of binary data is on a single impulse per character basis with the value or identity of that character dependent upon the manifestation of the previous value or character. Thus, an impulse denoting one binary number is established after two succeeding spacings substantially equal to each other and the other binary character is effected by an impulse occurring after two other impulses spaced by substantially different spacing, but without impulses spaced by substantially different spacing, but without regard to the order or the occurrence of the different spacings.

The simple circuit arrangements for decoding RPM printed bar coding characters and characters recorded in a magnetic medium by PRM techniques lend themselves to the decoding of characters laid down according to the same principles and also according to PRM principles. According to the invention, PRM coding can be decoded using RPM demodulating circuitry and simple electronic logical circuitry for translating the RPM decoded output data to true F2F data.

Both PRM and RPM are applied in practice to data processing for the same or similar operations. As a matter of fact, there are instances where both may be or are in use or desirable in the same operation. It has been recognized that in many cases demodulating circuitry for one coding system produces unique or singular output when applied to coding of a similar but different system. Thus, suitable converting methods and circuitry is an objective that has been sought.

Manual scanning of coded data is highly desirable at the present time. The principle difficulty lies in the varying speeds at which a human operator transverses the recorded data. An important advantage of RPM coding is the self-clocking feature or the ability to be sensed over a wide range of speeds even for a single pass over RPM coded data.

Accordingly, the invention is directed to methods and circuitry for converting a data stream emanating from the decoding of data manifested in one coding scheme by sensing in accordance with the principles of another coding scheme and translating the resulting decoded data to data in the one coding scheme.

According to the invention, binary data recorded in one coding is demodulated in accordance with another coding to produce "raw" data in two levels and "raw" strobe information at each data sensing impulse. This raw material is rendered by logical circuitry arranged to block extraneous, improperly timed strobe impulses and to establish two output data levels indicative of the true data in the one coding. The shift from naughts to units in the one coding is evidenced by the appearance of a naught in the other coding as is the converse shift from units to naughts in the one coding. Such a shift obtains on each naught in the other coding; that is, consecutive naughts result in consecutive shifts of data values. A maximum of two consecutive naughts in the other coding stems from the relationship of the two codings where the one is F2F PRM and the other is RPM coding. In that translation superfluous circuits in the other coding must be blanked. Similarly, these superfluous units are blocked from affecting the strobe or clocking pulse trains.

Logical circuitry according to the invention for performing the translating function comprises conventional pegging circuitry for maintaining a reference to the prior-to-instantaneous state of operation, storage circuitry for storing pertinent consecutive data, gating circuitry for comparing the state-of-operation with consecutive data and translating the coding accordingly, and delaying circuitry for insuring positive reaction of the component circuitry.

Basic logical circuitry comprises four latching circuits for referencing the four possible states in translating binary coding, together with AND gating circuitry pertinent to possible unique characteristics associated with each state depending on the instantaneous and immediately preceding data as stored in a two-stage shift register. More specific advanced logical circuitry comprises but two flip-flop circuits of the type referred to as having J-K characteristics and associated AND and OR gating circuits connected in accordance with the basic principles for both pegging two states of operations and immediately preceding data for triggering in accordance with the unique characteristics of the related codings.

Further, according to the invention, advanced logical circuitry is arranged for self-synchronizing the overall circuitry by recording predetermined data patterns in the Start of Message (SOM) character string of the data stream.

Still further, according to the invention, logical circuitry is arranged with a latching circuit and AND and OR gating circuits for automatically switching from demodulating of one coding to demodulating the other coding by determining the translated version of the coding on the SOM characters and setting a latching circuit accordingly.

In order that the full advantage of the invention may be attained in practice, preferred embodiments thereof, given by way of example only, are described in detail hereinafter with reference to the accompanying drawing, forming a part of the specification, and in which.

Figure 1:
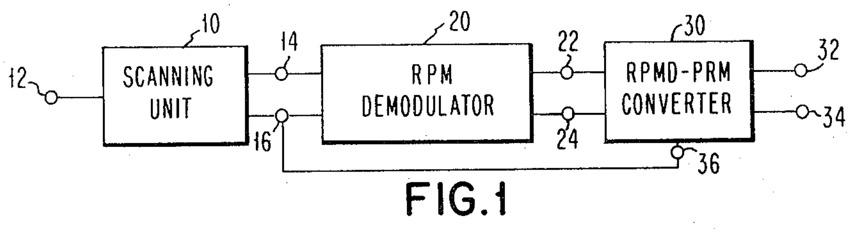
FIG. 1 is a functional diagram of a primary arrangement of circuitry according to the invention.

A functional diagram of the primary arrangement of the invention is shown in FIG. 1. A conventional scanning unit 10 is arranged to develop a data signal from an electric current wave applied to an input terminal 12. One example of such an input current wave is that from a photoresponsive device scanning the light and dark area of a document. Another example is that from an electromagnetic transducer scanning over a magnetic record medium having areas of differing polarity. The data signal is delivered at an output terminal 14 and an "actuated" signal level is presented at a terminal 16 for use in controlling subsequent circuitry. The data output signal is applied to a conventional RPM demodulator 20. An example of such a demodulator is given in U.S. Pat. No. 3,708,748, filed on the 27th day of April, 1970, and issued on the 2nd day of Jan., 1973, to Ernie George Nassimbene for "Retrospective Pulse Modulation and Apparatus Therefor." Another example of an RPM demodulating circuit is found in U.S. Pat. application Ser. No. 131,234 of Thomas Frank O'Rourke, filed on the 5th day of April, 1971, for "RPM Coding and Decoding Apparatus Therefor." Potential levels representing data are delivered at an output terminal 22 and a strobe pulse train is delivered at a strobe pulse terminal 24. When demodulating RPM coded messages the output waves at the terminals 22 and 24 are true RPM data level and strobe pulse waves ready for use in subsequent circuitry. When demodulating PRM coded messages, the output RPM Demodulated (RPMD) waves at the terminals 22 and 24 will appear very much like RPM data but will not be either true RPM or true PRM data. A converting circuit 30 is arranged according to the invention for converting RPM Decoded (RPMD) data to true PRM data at an output terminal 34. The "actuated" signal at the terminal 16 is applied at an auxilliary terminal 36 for operating the converting circuit 30 only when the scanning unit 10 is actuated.

Figure 2:
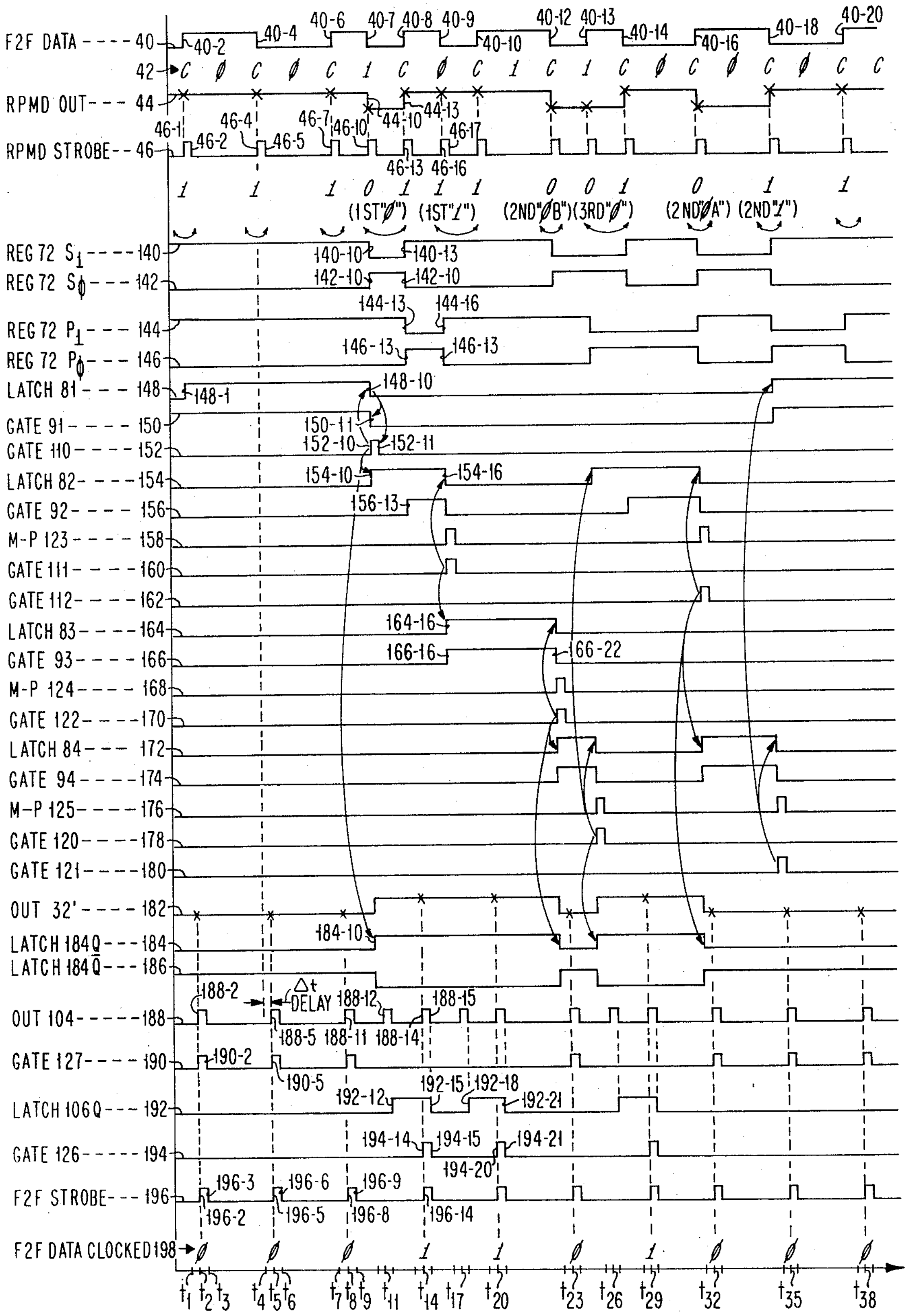
FIG. 2 is a graphical representation of waveforms useful in an understanding of the invention.

FIG. 2 is a graphical representation of waveforms useful in understanding the operation of the converting circuitry according to the invention. An example of a signal wave at the output terminal 14 is represented by a curve 40 of an ideal signal wave such as will be obtained from an ideal electromagnetic transducer traversing a magnetic record medium, for example. Uniformly spaced (even numbered) impulses 40-2, 40-4, 40-6, . . . 40-20 are available as clocking impulses; this is indicated by the letter C below these impulses in line 42. In the illustrated F2F version of PRM, a binary value of one nature, for example a binary unit 1, is established by an impulse midway of a pair of clocking impulses, as for example (odd numbered) impulses 40-7, 40-9, . . . 40-13 in the curve 40. The curve 40 represents a signal having a Start-of-Message (SOM) indicator in the form of a number of naughts and a unit preceding the significant numbers of data and and End-of-Message (EOM) indicator in the form of other naughts succeeding the data as is conventional in magnetic stripe record systems. Below the curve 40 in the line 42 are binary numbers (1, $\phi$) corresponding to the information being conveyed in PRM coding by the wave represented by the curve 40. These numbers are located at time positions midway between clocking impulses as it is conventional in many, if not in most, PRM applications to inspect the signal at these times for resolving data. The copending U.S. Pat. application Ser. No. 287,132, filed on the 7th day of Sept., 1972, of William Arnold Boothroyd for "Demodulating Circuitry for Pulse Rate Modulation Data Reproduction" describes circuitry for resolving F2F data at clock impulse time. Such operation is not illustrated, however, since the same numbers are involved but shifted with respect to the clock impulse position as those skilled in the art will immediately appreciate. A curve 44 represents the output level of the RPM demodulator 20 at the terminal 22, while a curve 46 represents the output at the terminal 24 which is a strobe pulse wave. The following line 48 indicates the binary values for the wave represented by the curve 40 but as decoded by the RPM demodulating circuit 20. These numbers have been placed at impulse time positions at this is the appropriate time for resolution by RPM methods and operations. In RPM demodulation the first two impulses (not shown here) are start and reference impulses which, in the general case, are not effective to produce data, but a binary value is established at every impulse, thereafter.

Figure 3:
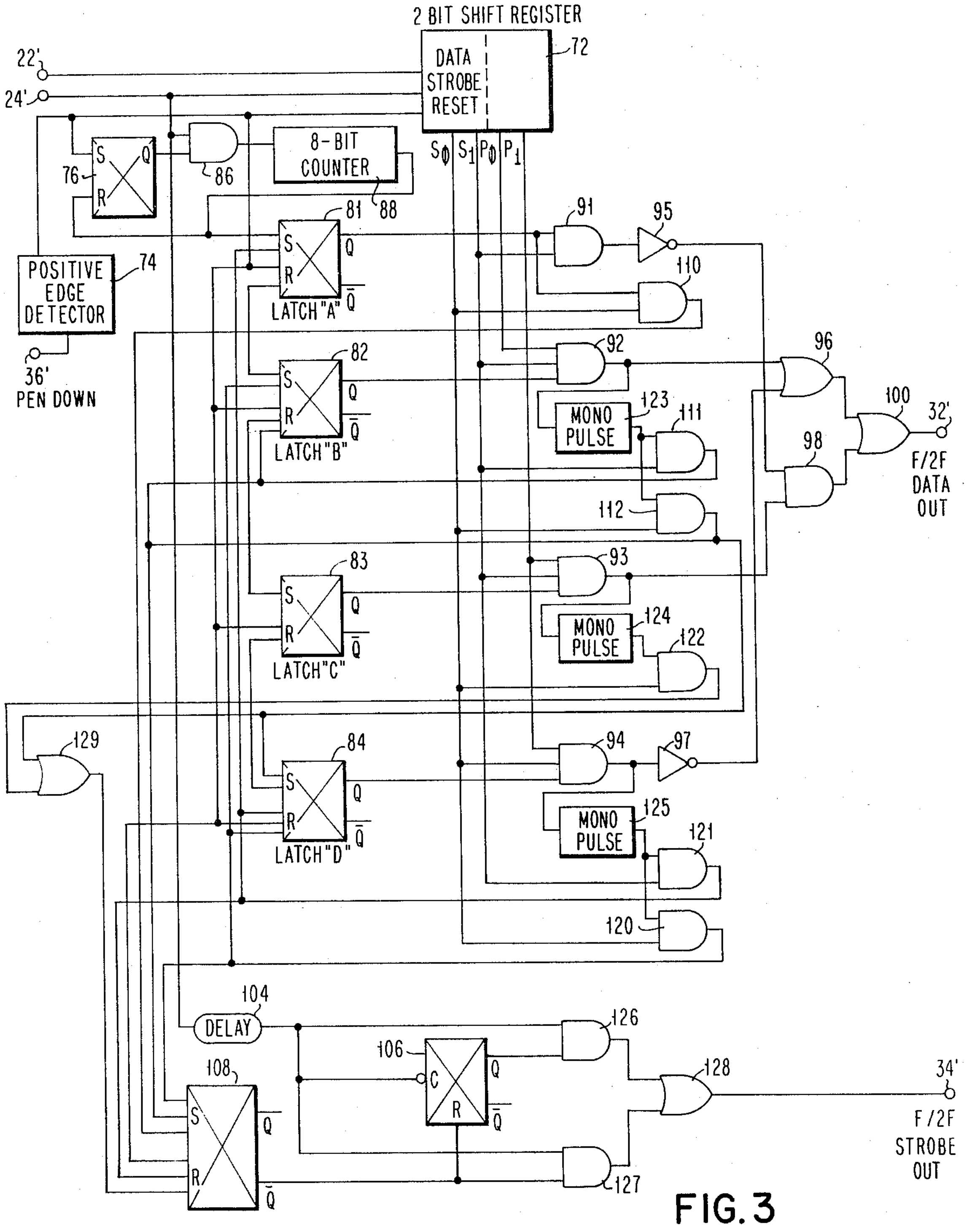
FIG. 3 is a functional diagram of converting circuitry for delivering true F2F data.
Figure 4:
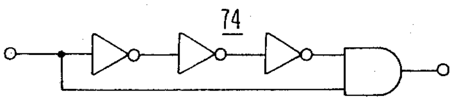
FIG. 4 is a diagram of a positive-edge detector circuit.
Figure 5:
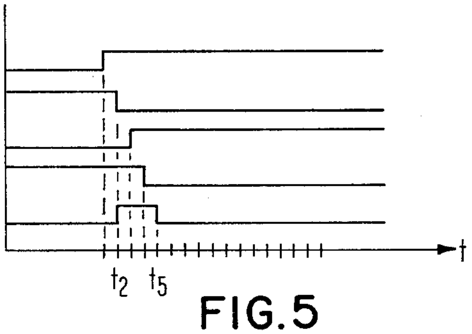
FIG. 5 is a graphical representation of waveforms resulting from the operation of the positive-edge detector circuit.

Circuitry 30 for converting the data such as is represented by the curve 40 to true F2F data is shown in FIG. 3. Those skilled in the art will readily apply the teachings to RPM and PRM coding in general as well as to the specific case illustrated here. The RPM Demodulating signal appearing at the input terminal 22' to a conventional two-bit shift register 72 having four output lines $P\phi$, $P_1$, and $S\phi$, and $S_1$ for indicating two successive data bits are received and for gating the logical circuitry in accordance with that data. Initialization of the register 72 is accomplished by applying a pulse from a positive-edge detector circuit 74 responsive to the probe actuate level at the input terminal 36'. An example of such a positive-edge detector circuit is functionally depicted in FIG. 4. The operation of the circuit is illustrated graphically in FIG. 5. Returning to FIG. 3, the initialization pulse also sets a "starting" latch 76 and resets four conventional electronic latches 81, 82, 83, and 84. The output of the starting latch 76 and the strobe pulse train are applied to an AND gating circuit 86 to step a counting circuit 88. The latter is arranged to count the initial pulse characters preceding significant data at which count a "carry" is generated by the counting circuit 88.

The counting circuit 88 in turn sets the first latch 81 and resets the starting latch 76 for the next operation. An AND gating circuit 91 is connected to the output line of the first latch 81 and to the $S_1$ line of the register 72. This AND gating circuit 91 is arranged to deliver an output representing true F2F $\phi$ when active, as will be shown. Similarly connected AND gating circuits 92, 93, and 94 are connected individually to the corresponding latch circuits 82, 83, and 84 and to appropriate lines of the register 72 as shown and later to be described in more detail. These AND gating circuits 92, 93, and 94 are arranged to deliver outputs representing F2F1, F2F1 and F2F$\phi$ respectively. The AND gating circuits 92 and 93 are connected to an OR gating circuit 96 for passing output from either of these F2F units generating circuits. Similarly another OR gating circuit (not shown) would be used for passing output representations of F2F naughts in some applications. For applications in which the output is sampled at strobe impulse times for one value (unit as given here), the other value (naught) is indicated by the absence of that one value. The AND gating circuits 91 and 94 are connected through inverting circuits 95 and 97 respectively to an AND gating circuit 98 and the output thereof along with the output of the OR gating circuits 96 is applied to a further OR gating circuit 100. The AND gating circuit 98 will deliver an output only if both AND gating circuits 91 and 94 are down because of the inverting circuits 95 and 97. Hence, if but one circuit 91 and 94 indicates a naught determination, no output will flow from the AND gating circuit 98.

Strobe pulses in F2F sequence are delivered at the strobe pulse terminal 34'. These pulses are delayed by means of a delay circuit 104 and a selection gate made of a flip-flop circuit 106, two AND gating circuits 126, 127 and an OR gating circuit 128. This gate is arranged to be closed from time to time in order to blank a RPMD strobe pulse that would result in an extraneous F2F strobe pulse. This operation will be described in more detail hereinafter.

The four pegging latches 81–84 are set and reset in response to the operation of six AND gating circuits 110, 111, 112, 120, 121, and 122 connected to the register 72 in permutations as shown. These AND gating circuits are arranged for detecting the relative occurrences of naughts and units in the RPMD signal which are significant because of the related characteristics of the two codes. Among these characteristics are (1) the shift from F2F naughts to F2F units and the converse is made only on RPMD naughts, (2) superfluous RPMD units follow the former shift and require strobe compensation, and (3) there is a maximum of two consecutive RPMD naughts. These change characteristics are tabulated in Table I. The character under consideration is always in column M and the previous character is in column P or column R. The open spacing indicates that the characters are all at clock inpulse times, while the close spacing indicates that one character appears midway of clocking impulse times. The accountants extension symbol @ indicates that "any character" may follow in a space beyond column D; that is, 1, φ or blank. The accountant's number symbol # in column S indicates a change in strobe pulsing. An algorithm for the change translation is diagrammed in FIG. 6. The F2Fφ state is established initially by the gating of an RPMD1 into the system. Any additional RPMD1 is ineffective to change state. The first RPMDφ will effect

TABLE I

Figure 6:
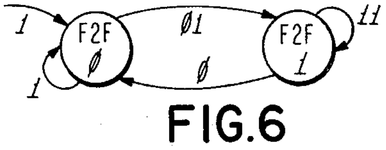
FIG. 6 is a diagramatic presentation of the code conversion algorithm.

| Logic Gate | Time | RPMD | S | Reg. | LU | Vernacular |
|---|---|---|---|---|---|---|
| 110 | $t_{10}$–$t_{12}$ | 1φ1 | # | S φ $P_1$ | 81 | "1st φ" |
| 111 | $t_{16}$–$t_{18}$ | 111 | # | $S_1P_1$ | 82 | "1st 1" |
| 122 | $t_{22}$–$t_{24}$ | 1 φφ | | S φ $P_1$ | 83 | "2nd φ B" |
| 120 | $t_{25}$–$t_{27}$ | φφ1 | # | φ p φ | 84 | "3rd φ" |
| 112 | $t_{31}$–$t_{33}$ | 1 φ @ | | S φ $P_1$ | 82 | "2nd $φ_A$" |
| 121 | $t_{34}$–$t_{36}$ | φ 1 @ | | $S_1$Pφ | 84 | "2nd 1" |

a change to the F2F1 state, and it will be followed invariably by an RPMD1 as shown in Table I, illustrated at times $t_{10}$–$t_{12}$, columns M and D, in the example depicted in FIG. 2; the character under consideration is always in column P. The latter unit must be ignored because there is an additional RPMD character over the PRM character count and the impulse also must be inhibited from generating an F2F strobe pulse. For this reason that following RPMD1 is shown in the diagram as associated with the first naught as φ1. Until another RPMDφ appears, the RPMD characters are pairs of units as shown in Table I, times $t_{16}$–$t_{18}$, columns P and M. These units are ineffective to change state but one of each pair must be inhibited in the strobe pulse recovery circuit. A lone RPMDφ as shown in Table I, $t_{22}$–$t_{24}$, column M, will change state back to F2Fφ as shown in the diagram of FIG. 6. The first RPMDφ of a pair as shown in Table I, $t_{25}$–$t_{27}$, will act in the same manner as a lone naught, and it will invariably follow an RPMD1 to effect an F2Fφ state. The second RPMDφ of the pair shown shifted into the adjacent left column R in Table I, $t_{31}$–$t_{33}$, is effective as the change combination at $t_{10}$–$t_{12}$, both as to data and as to strobe. The combination at $t_{34}$–$t_{36}$ is the only remaining variant in the change patterns and it effects no change in state as it is a single unit following a single naught. The columns Reg. and LU indicate the up level output of the Register 72 and the latch that arm and enable the AND gating circuits which indicate the change characteristics and accordingly control the associated circuitry. The vernacular column lists designations of the change characteristics that evolved as the design of the four latch circuit progressed. It should be noted that these designations apply only in the one case of the coding assigned strictly as shown in the example. It should be borne in mind that the circuitry is equally applicable for all four possible coding assignments of binary values in the two codes. The shift in characteristics is determined principally by the unique output levels of the Register 72, however, "1st φA, 2nd φA and 2nd φB" are determined by the output levels of the associated latches.

Figure 7:
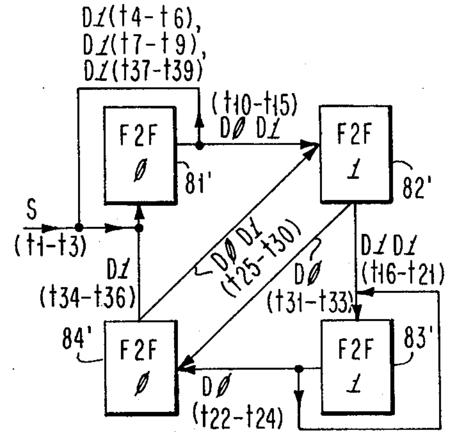
FIG. 7 is a state-of-operation diagram of the circuitry shown in FIG. 3.

The sequence of operations is illustrated by a state-of-operation diagram of FIG. 7 in which the rectangles 81′–84′ correspond loosely to the circuitry associated with the respective latches 81–84. Timing notation is for the same example hereinbefore described. From this diagram the requirement for a two-stage shift register is seen in the operation of the AND gating circuits on the various register levels. The RPMD output of a binary unit 1 corresponding to PRMEncoded (PRME) naught φ enters on the line S as RPMD units 1 only. Successive RPMD units loop back on the same state, producing F2Fφ's until a RPMD naught appears. The state then changes to F2F1 level setting the latch 82. Invariably, this naught is followed by a unit, and a strobe pulse must be blocked. Pairs of RPMD units will maintain the F2F1 level but a single RPMDφ will translate to the F2Fφ level, setting the latch 84. From this state, an RPMD unit will maintain the F2Fφ or a naught followed by a unit effects a change to F2F1 level. The AND gating circuit 110 (FIG. 3) detects the first RPMDφ and the AND gating circuit 111 detects any following RPMD1. AND gating circuits 112 and 122 detect RPMDφ next appearing, while the AND gating circuits 120 and 121 detect subsequently appearing RPMDφ and 1. The AND gating circuits 110, 111, 120, and 121 are also connected to the status latch circuit 108 along with AND gating circuits 112 and 122 through an OR gating circuit 124 for blanking superfluous impulses of the RPMD strobe from generating erroneous strobe pulses in the resulting F2F strobe pulse train.

The operation of the circuitry 30 will more clearly be understood from the sequence of operations in Table II in connection with the curves in FIG. 2.

The output levels of the two-bit shift register 72 that obtain in accordance with data as represented by the curve 40 are represented by the curves 140, 142, 144 and 146. For the same data, curve 148 represents the output levels of latch 81. The output levels of the AND gating circuit 91 are represented by the curve 150, while the pulse output of the AND gating circuit 110 is represented by the curve 152. A curve 154 represents the output of the latching circuit 82 while curves 156, 158, 160 and 162 represent the output levels of the AND gating circuit 92, the monopulsing circuit 123, the AND gating circuit 111, and the AND gating circuit 112 respectively. A curve 164 represents the output levels of the latching circuit 83 and curves 166, 168 and 170 represent the operation of the AND gating circuit 93, the monopulsing circuit 124, and the AND gating circuit 122. The operation of the latching circuit 84 and the associated AND gating circuit 94, 120, and 121 and the monopulsing circuit 125 are represented in the curves 172, 174, 176, 178 and 180, with a curve 182 which represents the levels of the data at output terminals 32′. The output levels of the strobe latching circuit 108 are represented by curves 184 and 186, while the operation of the delay circuit 104 represented by the curve 188 will be seen to delay the pulse train of curve 46 by a predetermined

TABLE II

| TIME | F2F IM-PULSES | RPMD CLOCK 24' | RPMD DATA 22' | 2BIT SHIFT REGISTER | | | | LATCH 81 | GATE 110 | LATCH 82 | GATE 111 | GATE 112 | LATCH 83 | GATE 122 | LATCH 84 | GATE 120 | GATE 121 | DATA OUT 32' | STROBE DELAY 104 | LATCH Q 186 | FF2 106 | STROBE 34' | F2F OUT |
|---|---|---|---|---|---|---|---|---|---|---|---|---|---|---|---|---|---|---|---|---|---|---|---|
| | | | | Sø | S1 | Pø | P1 | | | | | | | | | | | | | | | | |
| $t_1$ | C | 1 | 1 | ø | 1 | ø | 1 | 1 | ø | ø | ø | ø | ø | ø | ø | ø | ø | ø | (Δt) | 1 | | | |
| $t_2$ | (8th ø) | | (8th 1) | | | | | (set by 8th 1) | | | | | | | | | | | 1 | | | 1 | ø |
| $t_3$ | | | | | | | | | | | | | | | | | | | | | ø | | |
| $t_4$ | C | 1 | 1 | ø | 1 | ø | 1 | 1 | ø | ø | ø | ø | ø | ø | ø | ø | ø | ø | (Δt) | 1 | | | |
| $t_5$ | (ø) | | | | | | | | | | | | | | | | | | 1 | | | 1 | ø |
| $t_6$ | | | | | | | | | | | | | | | | | | | | | ø | | |
| $t_7$ | C | 1 | 1 | ø | 1 | ø | 1 | 1 | ø | ø | ø | ø | ø | ø | ø | ø | ø | ø | (Δt) | 1 | | | |
| $t_8$ | (ø) | | | | | | | | | | | | | | | | | | 1 | | | 1 | ø |
| $t_9$ | | | | | | | | | | | | | | | | | | | | | ø | | |
| $t_{10}$ | 1 | 1 | ø | 1 | ø | ø | 1 | ø | 1 | 1 | ø | ø | ø | ø | ø | ø | ø | 1 | (Δt) | ø | | | |
| $t_{11}$ | | | | | | | | (Reset by 1st ø) | | (Set by 1st ø) | | | | | | | | | 1 | (Set by 1st ø) | | ø | |
| $t_{12}$ | | | | | | | | | | | | | | | | | | | | | 1 | | |
| $t_{13}$ | C | 1 | 1 | ø | 1 | 1 | ø | ø | ø | 1 | ø | ø | ø | ø | ø | ø | ø | 1 | (Δt) | ø | | | |
| $t_{14}$ | | | | | | | | | | | | | | | | | | | 1 | | | 1 | 1 |
| $t_{15}$ | | | | | | | | | | | | | | | | | | | | | ø | | |
| $t_{16}$ | 1 | 1 | 1 | ø | 1 | ø | 1 | ø | ø | ø | 1 | ø | 1 | ø | ø | ø | ø | 1 | (Δt) | ø | | | |
| $t_{17}$ | | | | | | | | | | (Reset by 1st 1) | | | (Set by 1st 1) | | | | | | 1 | | | ø | - |
| $t_{18}$ | | | | | | | | | | | | | | | | | | | | | 1 | | |
| $t_{19}$ | C | 1 | 1 | ø | 1 | ø | 1 | ø | ø | ø | ø | ø | 1 | ø | ø | ø | ø | 1 | (Δt) | ø | | | |
| $t_{20}$ | | | | | | | | | | | | | | | | | | | 1 | | | 1 | 1 |
| $t_{21}$ | | | | | | | | | | | | | | | | | | | | | ø | | |
| $t_{22}$ | C | 1 | ø | 1 | ø | ø | 1 | ø | ø | ø | ø | ø | ø | 1 | 1 | ø | ø | ø | (Δt) | 1 | | | |
| $t_{23}$ | (ø) | | | | | | | | | | | | (Reset by 2nd øB) | | (Set by 2nd øB) | | | | | (Reset by 2nd øB) | | 1 | ø |
| $t_{24}$ | | | | | | | | | | | | | | | | | | | | | ø | | |
| $t_{25}$ | 1 | 1 | ø | 1 | ø | 1 | ø | ø | ø | 1 | ø | ø | ø | ø | ø | 1 | ø | 1 | (Δt) | ø | | | |
| $t_{26}$ | | | | | | | | | | (Set by 3rd ø) | | | | | (Reset by 3rd ø) | | | | 1 | (Set by 3rd ø) | | ø | - |
| $t_{27}$ | | | | | | | | | | | | | | | | | | | | | 1 | | |
| $t_{28}$ | C | 1 | 1 | ø | 1 | 1 | ø | ø | ø | 1 | ø | ø | ø | ø | ø | ø | ø | 1 | (Δt) | ø | | | |
| $t_{29}$ | | | | | | | | | | | | | | | | | | | 1 | | | 1 | 1 |
| $t_{30}$ | | | | | | | | | | | | | | | | | | | | | ø | | |
| $t_{31}$ | C | 1 | ø | 1 | ø | ø | 1 | ø | ø | ø | ø | 1 | ø | ø | 1 | ø | ø | ø | (Δt) | 1 | | | |
| $t_{32}$ | (ø) | | | | | | | | | (Reset by 2nd øA) | | | | | (Set by 2nd øA) | | | | 1 | (Reset by 2nd øA) | | 1 | ø |
| $t_{33}$ | | | | | | | | | | | | | | | | | | | | | ø | | |
| $t_{34}$ | C | 1 | 1 | ø | 1 | 1 | ø | 1 | ø | ø | ø | ø | ø | ø | ø | ø | 1 | ø | (Δt) | 1 | | | |
| $t_{35}$ | (ø) | | | | | | | (Set by 2nd 1) | | | | | | | (Reset by 2nd 1) | | | | 1 | | | 1 | ø |
| $t_{36}$ | | | | | | | | | | | | | | | | | | | | | ø | | |
| $t_{37}$ | C | 1 | 1 | ø | 1 | ø | 1 | 1 | ø | ø | ø | ø | ø | ø | ø | ø | ø | ø | (Δt) | 1 | | | |
| $t_{38}$ | (ø) | | | | | | | | | | | | | | | | | | 1 | | | 1 | ø |
| $t_{39}$ | | | | | | | | | | | | | | | | | | | | | ø | | |

time interval. The curves 190, 192, 194 and 196 represent the operation of the AND gating circuit 127, the flip-flop circuit 106 and the AND gating circuit 126 in producing the F2F strobe pulse train at the output terminal 34'. The binary numerals corresponding to the data represented by the curve 40 are indicated on a line 198, while a line 200 indicates the sequence of points in time at which the transitions in the various curves occur.

At the time $t_1$, a positive going transition 40-2 in curve 40 and a positive going transition 46-1 in curve 46 appear at the time of the 8th naught (clocking) pulse which is evidenced by the carry pulse of the eight bit counter 88. The carry pulse effects the transition 148-1 for setting the latching circuit 81. At the time $t_2$ delayed transitions 188-2 and 190-2 appear in curves 188 and 190 respectively, for producing the first output strobe pulse 196-2, 3 in curve 196. The next data transition 40-4 in curve 40 appears at the time $t_4$ coincident with the strobe transition 46-4 in curve 46. At the time $t_5$ later than the time $t_4$ by the predetermined delay, brought about by the delay device 104, transitions 188-5 and 190-5 are developed for producing the second strobe pulse 196-5, 6 in the curve 196. The remainder of the strobe pulses shown in the curve 196 are generated in the same fashion, whereby probe pulse development will be discussed hereinafter, only in connection with the blanking or elimination of possible strobe pulses superfluous to F2F output data.

Without a change in data value, the circuit will continue to operate as described. The output at the output terminal 32 prime will remain down as shown by curve 182 each time it is strobed by the F2F strobe pulses at terminals 34', as shown in curve 196. Thus, at time $t_7$, the transition 40-6 in curve 40 will effect the transition 46-7 in curve 46, initiating the generation of the third strobe pulse 196-8, 9. At the time $t_{10}$, the transition 40-7 will effect a negative transition 44-10 in curve 44 indicating a change in RPMD data, and another transition 46-10 in curve 46, which if so permitted, would effect an F2F strobe pulse, which would be superfluous. Thus far, the circuit 30 has been set to pass RPMD strobe pulses through the time delay device 104 through an AND gating circuit 127 as enabled by the probe latching circuit 108 which was placed in the reset condition by the detector circuit 74. The AND gating circuit 127 is disabled by setting the strobe latching circuit 108 on sensing change in the output data value. Disregarding the resolution of data for time being, except as incidental to the resolution to the probe pulses, the first change in data value is sensed by the AND gating circuit 110. This AND gating circuit was enabled by the setting of the latching circuit 81 as shown in curve 148. The S 1 line of the register 72 dropped down and the S $\phi$ line rose in response to the change of data as evidence by the transitions 140-10 and 142-10 in curves 140 and 142. Thus, the output line of the AND gating circuit 110 rose at transition 152-10 and in turn latch 82 is inset at transition 154-10 in curve 154 and latch 108 was set at transition 184-10 of curve 184. This raising of AND gating circuit 110 after a delay from time $t_{10}$ to $t_{11}$, reset latch 81 at transition 148-10 in curve 148 and latch 91 likewise, at transition 150-10 in curve 150, at which time the AND gating circuit 110 dropped down as indicated by transition 152-11 in curve 152. At the output of the delay line 104, the output level rose at time $t_{11}$ as indicated by transition 188-11 in curve 188, and dropped back at time $t_{12}$, as indicated by transition 188-12. At this time, the flip-flop circuit 106 was that as indicated at transition 192-12 in curve 192 for readying AND gating circuit 126. The next transition in the F2F data curve 40 will be a clocking transition which occurs at time $t_{13}$ coincidence with the transitions 44-13 and 46-13 in the RPMD data curve 44 and the RPMD strobe curve 46 respectively. Both stages of the register 72 are changed as indicated by transitions 140-13, 142-13, 144-13, and 146-13 in the corresponding curves. The AND gating circuit 92 is brought up as indicated by transition 156-13 in curve 156. The delay element 104 will delay the transition 188-14 in curve 188 time $t_{14}$ whereby the output terminal 32′ rises at transition 194-14 and falls at transition in coincidence with the strobe pulse transitions 196-14, 196-15, as shown in curves 194 and 196 respectively. Thus, a determination of a binary unit and the sensing of a strobe pulse midway of an F2F cell has effectively been shifted to the clocking impulse of that cell.

At time $t_{16}$ and $F2F_1$ is again evidenced by transition 40-9 in curve 40. The data level indicated in curve 44 remains up as indicated. The strobe pulse is depicted in curve 46 by transitions 46-16 and 46-17. In this instance, the RPM data level is at the unit level so that only change of state lies in the necessity for eliminating an otherwise superfluous strobe pulse. Only the $P_1$ and P $\phi$ lines of the register 72 change, as indicated by transitions 144-16 and 146-16 in the corresponding curves. The latch 82 is reset at transition 154-16 in curve 154 in response to AND gating circuit 111 coming up as indicated by transition 160-16 in curve 160, which transition also results in the setting of latch 83 as seen in curve 164, transition 164-16, AND gating circuit 93 comes up at time $t_{16}$ as indicated by transition 166-16 in curve 166. The strobe latching circuit 108 remains up whereby no strobe pulse is generated at the terminal 34′. The remainder of the circuit 30 remains in readiness for generating an output pulse at terminal 32′ as indicated by transitions 194-20 and 194-21 of curve 94 when corresponding strobe pulse, as shown in curve 196 is generated as hereinbefore described.

At time $t_{22}$, another change is sensed. The transition 40-12 in curve 40 indicates that an F2F naught is to be translated and the PRM data curve 44 drops at transition 44-22. The translating circuit 30 functions similarly to the manner hereinbefore described, except that latching circuit 83, AND gating circuit, and monopulsing circuit 124 are involved, for preventing an output at terminal 32′ and terminal 34′ at times $t_{26}$ and $t_{27}$ and preventing an output at terminal 32′ between times $t_{29}$ and $t_{30}$ while delivering a strobe pulse at output terminal 34′ between times $t_{29}$ and $t_{30}$.

The next change in translation occurs at time $t_{25}$ wherein an F2F unit is sensed, and the circuit 30 operates to suppress both the unit pulse and the strobe pulse terminals 32′ and 34′ at this time, but in effect, to delay the deliverance of those pulses until between times $t_{29}$ and $t_{30}$. Similarly, the remainder of the changes as indicated in Table II produce the desired pulsed outputs at terminal 32′ and 34′ respectively, whereby no further detailed discussion is believed necessary.

Thus far, there has been described, a generalized system for translating from PRM coding, specifically that known as F2F coding, and sensed by RPM demodulating apparatus in such terms and by such an example that variations in the coding schemes can be accommodated in circuits designed by those skilled in the art for the particular variations of coding at hand.

Figure 8:
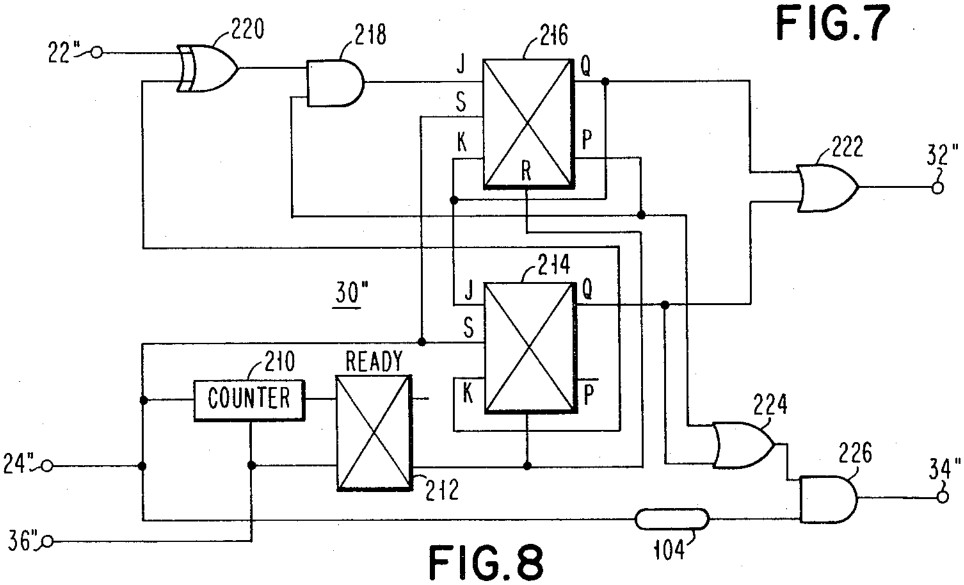
FIG. 8 is a functional diagram of alternate converting circuitry for delivering true F2F data.

An example of a translating circuit 30″ having fewer components for performing all of the functions of circuitry described hereinbefore, is given in the logical circuit diagram of FIG. 8. A counter 210, which may be an 8-bit counter for example, has an overflow line connected to the set terminals of a ready latch 212 of the bilateral flip-flop variety. In this arrangement, potential is applied at the probe control terminals 36″ to the counter 210 and the reset terminals of the latch 212 to maintain them in the reset condition, which in turn maintains two J-K type flip-flop circuits 214 and 216 in the reset condition. The J-K flip-flop circuit is a well known resetable gated type of reciproconductive circuit. With reset potential applied at the reset terminal R, direct output terminal Q is at a down level and the inverted output terminal P is at an up level. The latter P terminal delivers an output invariably inverted with respect to that of the Q terminal and is frequently referred to as a $\bar{Q}$ (not Q) terminal by the artisan. These levels will be maintained when the reset potential is removed regardless of the potential levels at the J and K terminals in the absence of any gating or strobe pulse at the S terminal. In the circuitry shown, the J-K flip-flop circuits change state when the strobe changes. When a strobe pulse is applied at the S terminal, no change in the Q-P terminal levels will be effected in both the J and the K terminals are at the down level. The J-K flip-flop circuit will reciprocate if both the J and the K terminals are at the up level when the strobe pulse is applied, whereby the Q terminal will come up and the P terminal will go down if they were in the condition previously mentioned. It should be noted at this point that the levels of the terminals Q and P will reciprocate on each application of a strobe pulse when the J and K terminals are both at the up level. Thus, a sequence of strobe pulses will result in reciprocation as long as the J and K terminals remain at the same up level. Regardless of the levels at the Q and P terminals, when the J and K terminals are of opposite level, the Q and P terminals will assume corresponding levels on the application of a strobe pulse. This versatile logic circuit device is arranged here in a dual functioning circuit for resolving both data and strobe pulses. An AND gate circuit 218 and an exclusive OR (XOR) gating circuit 220 and an OR gating circuit 222 are connected for processing data pulses or levels, while at the same time an OR gating circuit 224 and an AND gating circuit 226 are arranged for processing strobe pulses. A time delay device 104 having the same characteristics as that in the previous circuitry, is interposed in the lead between the RPMD strobe pulse input terminals 24'' and the AND gating circuit 226 whereby the F2F strobe pulses appearing at the output terminals 34'' occur slightly after any change in F2F levels at the data output terminal 32''.

Figure 9:
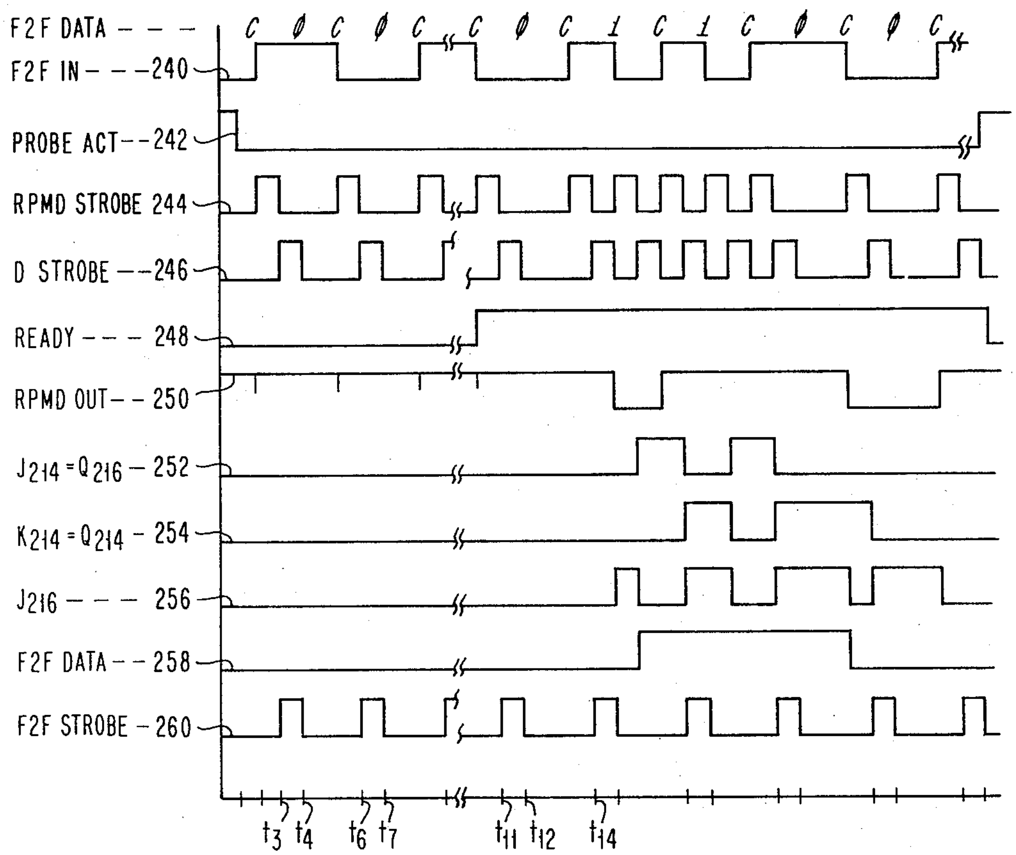
FIG. 9 is a graphical representation of waveforms useful in an understanding of the alternate converting circuitry.

When the reset terminals 36'' are brought down by actuation of the associated probe, the counter 210 is in readiness for operation, and the ready latching circuit 212 remains reset, as do the J-K flip-flop circuits 214 and 216. The F2F data input to the RPMD modulator is represented by a curve 240 in the timing diagram of FIG. 9. A curve 242 indicates the levels at the terminals 36'' which result from actuation of the probe. Strobe pulses appearing at the terminals 24 are represented by a curve 244 and the same pulses delayed by the time delay device 104 for enabling the AND gating circuit 226 are represented by curve 246. The levels of the ready latch 212 are represented by curve 248, while the RPMD data appearing at terminals 22' is represented by the levels in a curve 250. A curve 252 represents the level at the Q and K terminals of the flip-flop circuits 216 and the J terminal of flip-flop 214 which are connected together. Similarly, a curve 254 represents the levels at the Q and K terminals of the flip-flop 214 and one input terminal of the XOR gating circuit 220, which are connected together, and the other input terminal of the OR gating circuit 222, as well as the output terminals 32'. The output of the AND gating circuit 218 and the J terminal of the flip-flop circuit 216 is represented by the curve 256. Curves 258 and 260 represent the levels of the F2F decoded data at the output terminals 32'' and the F2F strobe pulses at terminals 34'' respectively. The timing sequence of the various transitions in the above mentioned curves are indicated by ticks on the abscissa 262. As seen from these curves, the counter 210 sets the ready latch 212 at the count of eight at time $t_{10}$. This operation is much the same as for the previous circuit, and those skilled in the art may modify it as a desire for the application at hand.

The ready latch 212 reciprocates and removes the reset potential from the flip-flops 214 and 216 readying them for operation according to the invention. The Q terminal of the J-K flip-flop 214 is at down level whereby the XOR gating circuit 220 is enabled for accepting the up level corresponding to the binary unit from the RPM demodulator. At time $t_{15}$, the P terminal of the flip-flop circuit 216 is enabling the AND circuit 218, both XOR circuit inputs are at the down level which puts the other input to the AND circuit 218 at the up level with the result that the J terminal of the flip-flop circuit 216 is at the up level. When the next RPMD strobe pulse arrives at the terminals 24'', the flip-flop circuit 216 is triggered, causing the latter to reciprocate and present a unit-level through the OR gating circuit 222 to the F2F output level 32''. The level of the Q terminal of the flip-flop 214 is raised as a result of the raising of the flip-flop circuit 216 and the next RPMD strobe pulse whereby a level is passed through the OR gating circuit 224, and presented to the AND gating circuit 226. The latter is enabled at the next time interval $t_{17}$ for presenting an F2F strobe pulse at the terminals 34''. Those skilled in the art will readily understand and follow the operation of the circuitry 30'' as depicted in the curves in FIG. 9.

Figure 10:
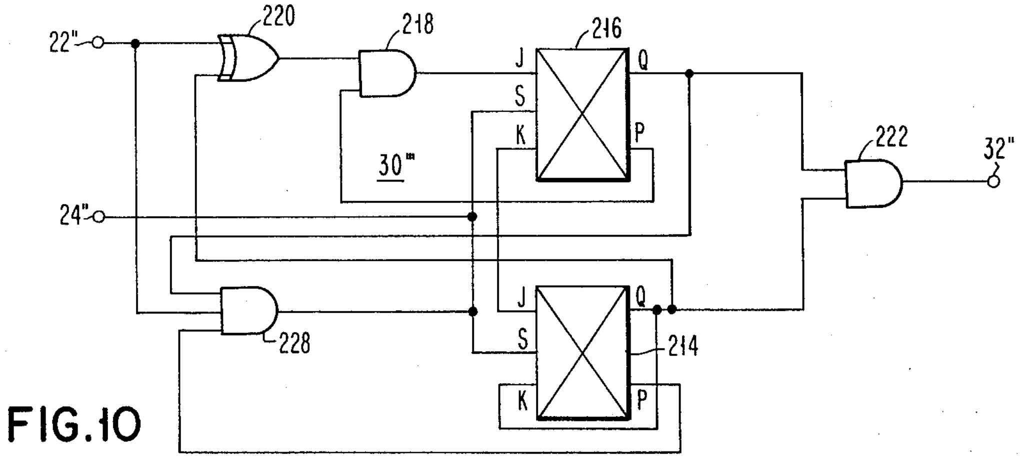
FIG. 10 is a functional diagram of the data processing portion only of another alternate converting circuit having automatic synchronizing properties.

The arrangement diagrammed in FIG. 8 is designed about the advantage that of the four states of operation of the two J-K flip-flop circuits 214 and 216, one is not used, and another is shared. A modification of this arrangement is shown in FIG. 10, where the data processing components only are shown in the interest of clarity. Here, the J-K flip-flop circuits 214 and 216, and J and K terminals respectively, are no longer directly connected to the Q terminal of J-K flip-flop circuit 216 but are connected to the output line of an AND gating circuit 228. The Q terminal of the J-K flip-flop circuit 214 and the P terminal of the flip-flop circuit 216 are connected to the input of the AND gating circuit 228 along with a line from the RPMD data input terminals 22''. These are the only changes made.

Those skilled in the art will substitute another form of logical level coincidence determining circuit for the AND gating circuit 228 and make the necessary interconnections in the logical flip-flop circuits used for performing the automatic synchronizing function as desired in the application at hand.

This modified circuit arrangement affords an automatic resynchronization of the translating circuit at the expense only of the AND gating circuit 228, should the circuit fall out of synchronization for some reason. The circuit will resynchronize if that is necessary, every time an F2F data bit pattern of binary 101 appears in the data stream. Such an F2F data pattern in the initializing portion of the data stream of course will afford the initial synchronization if for some reason a long string of binary zeros appears undesirable.

Figure 11:
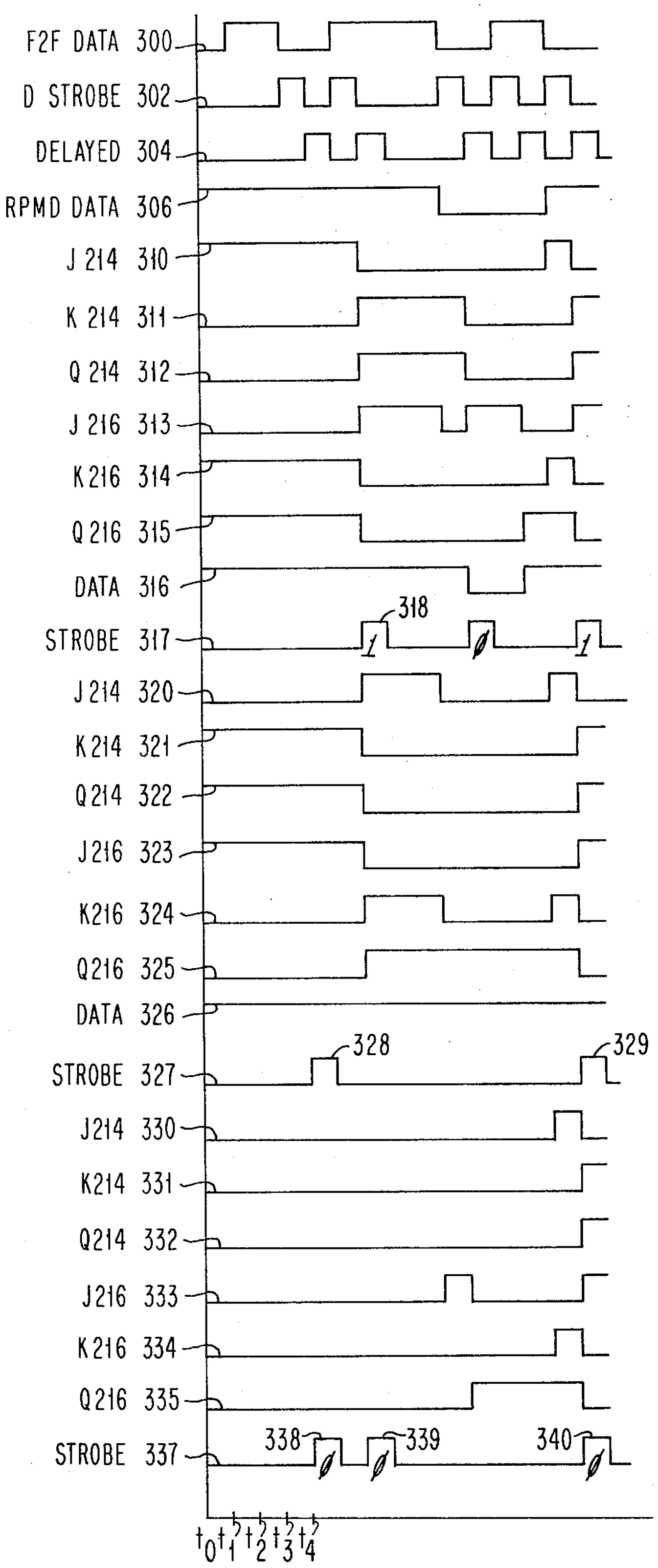
FIG. 11 is a graphical representation of waveforms useful in an understanding of the automatic synchronizing operation.
Figure 2:
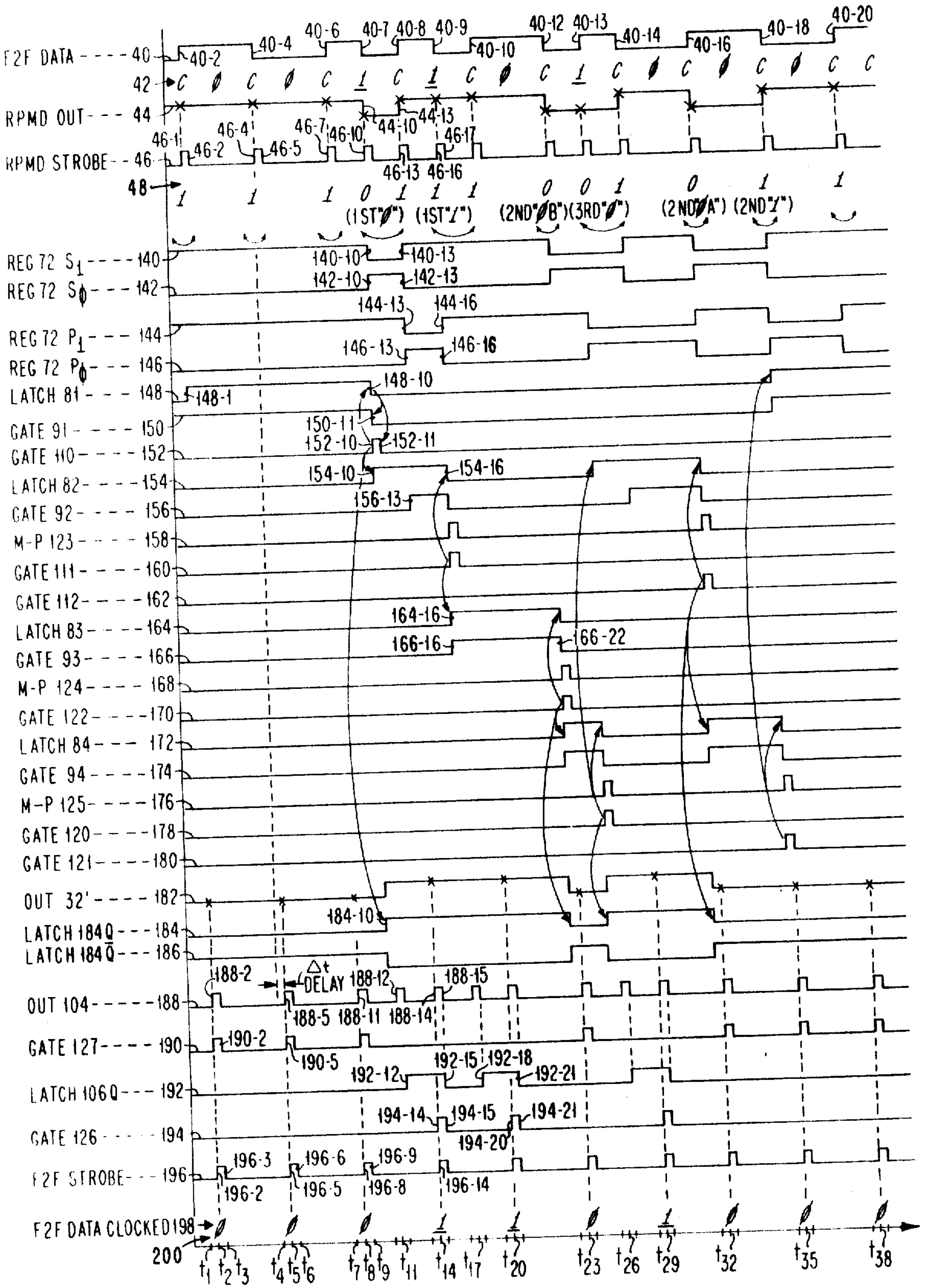
Figure 3:
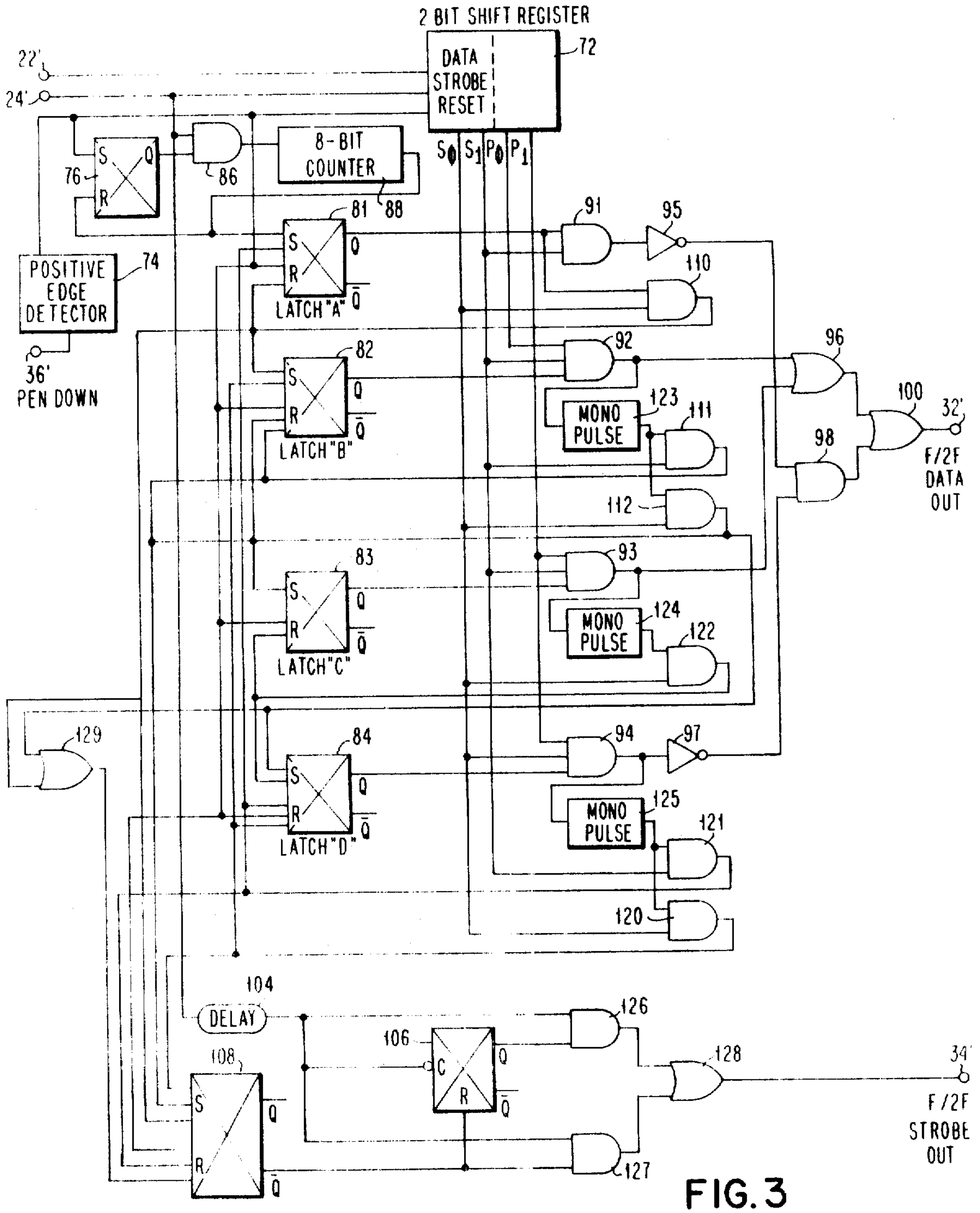
Figure 4:
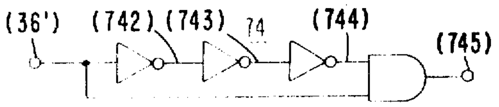
Figure 5:
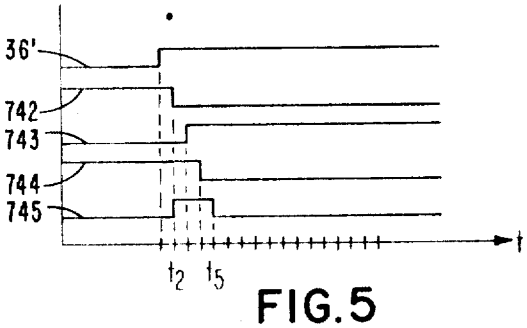
Figure 8:
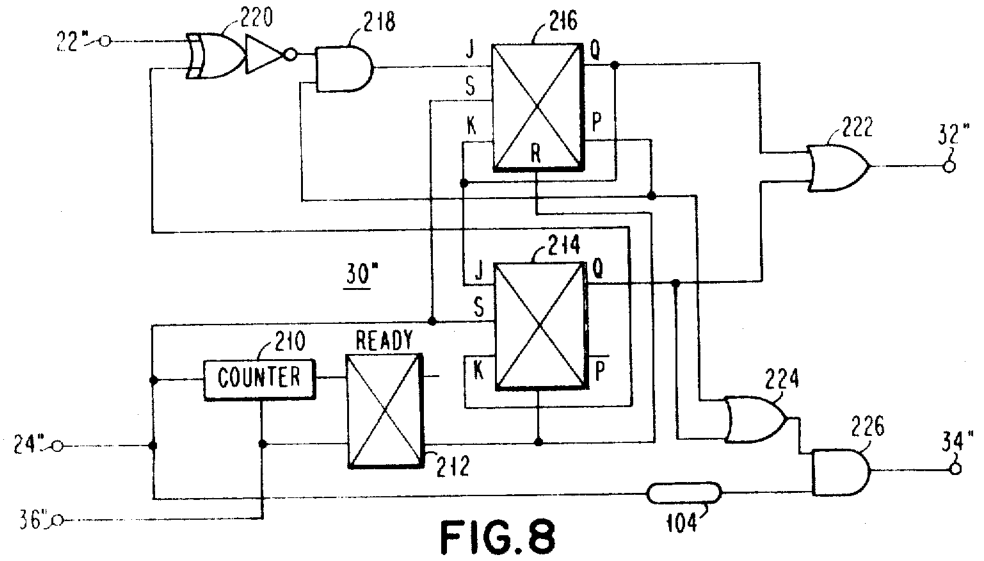
Figure 10:
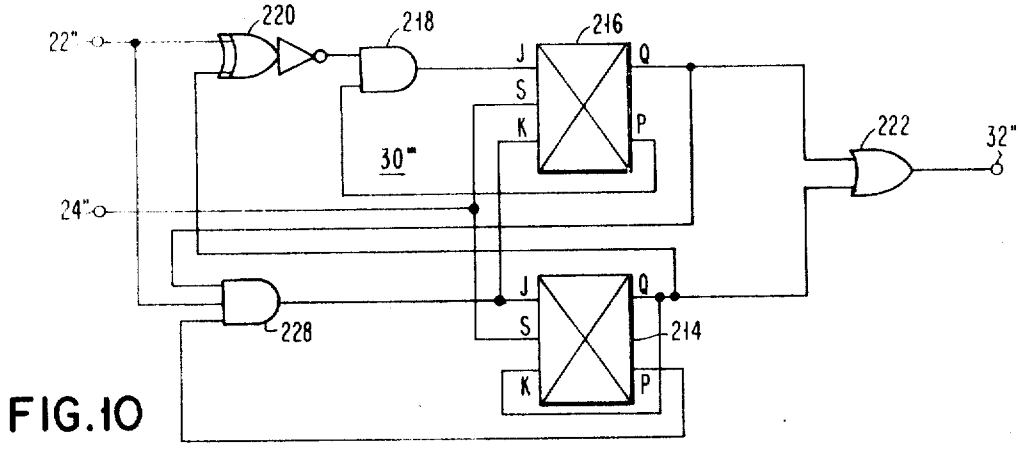
Figure 9:
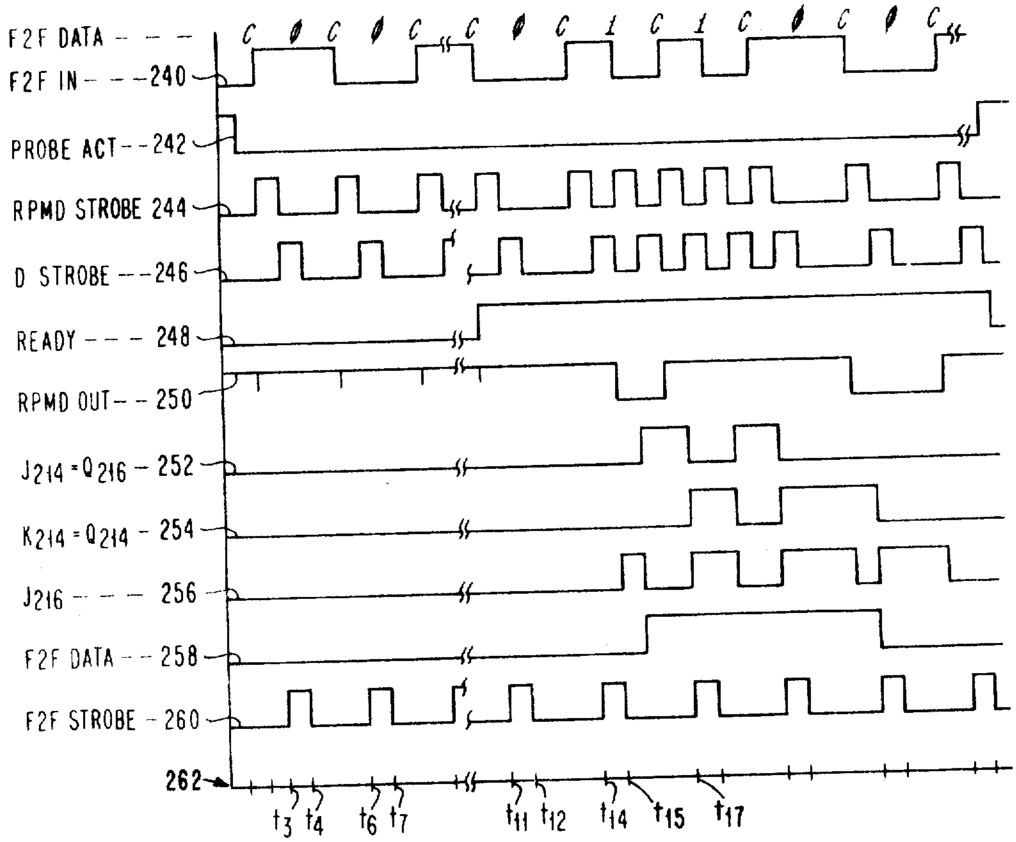
Figure 12:
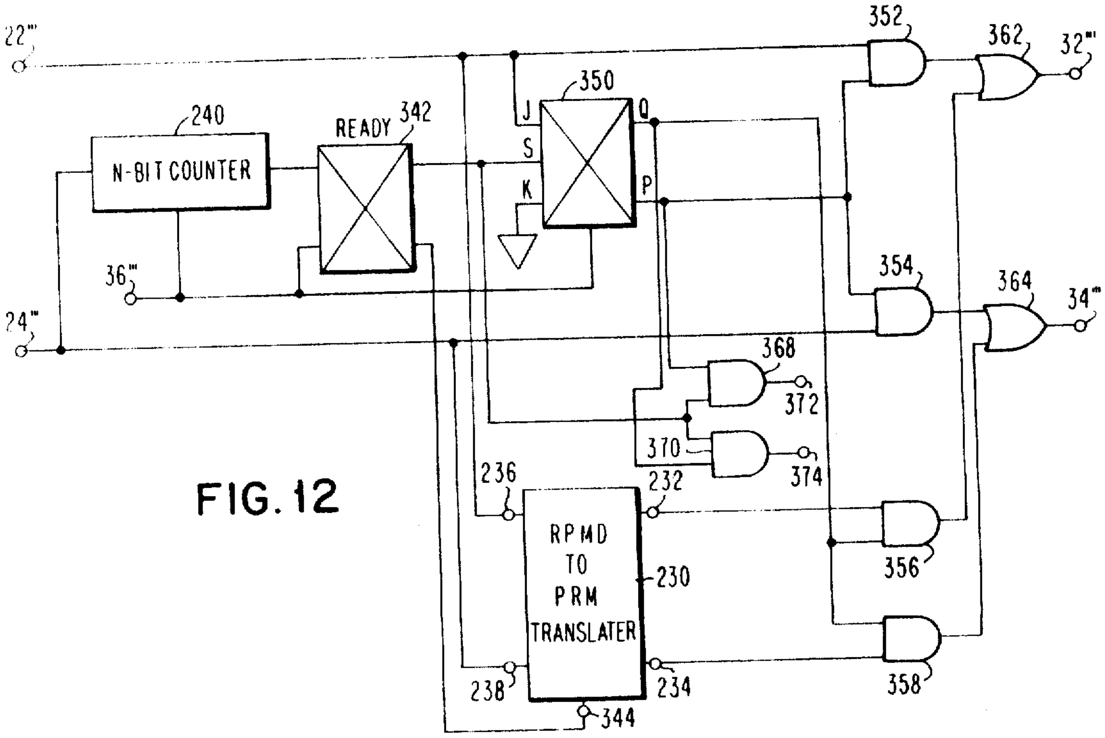
Figure 11:
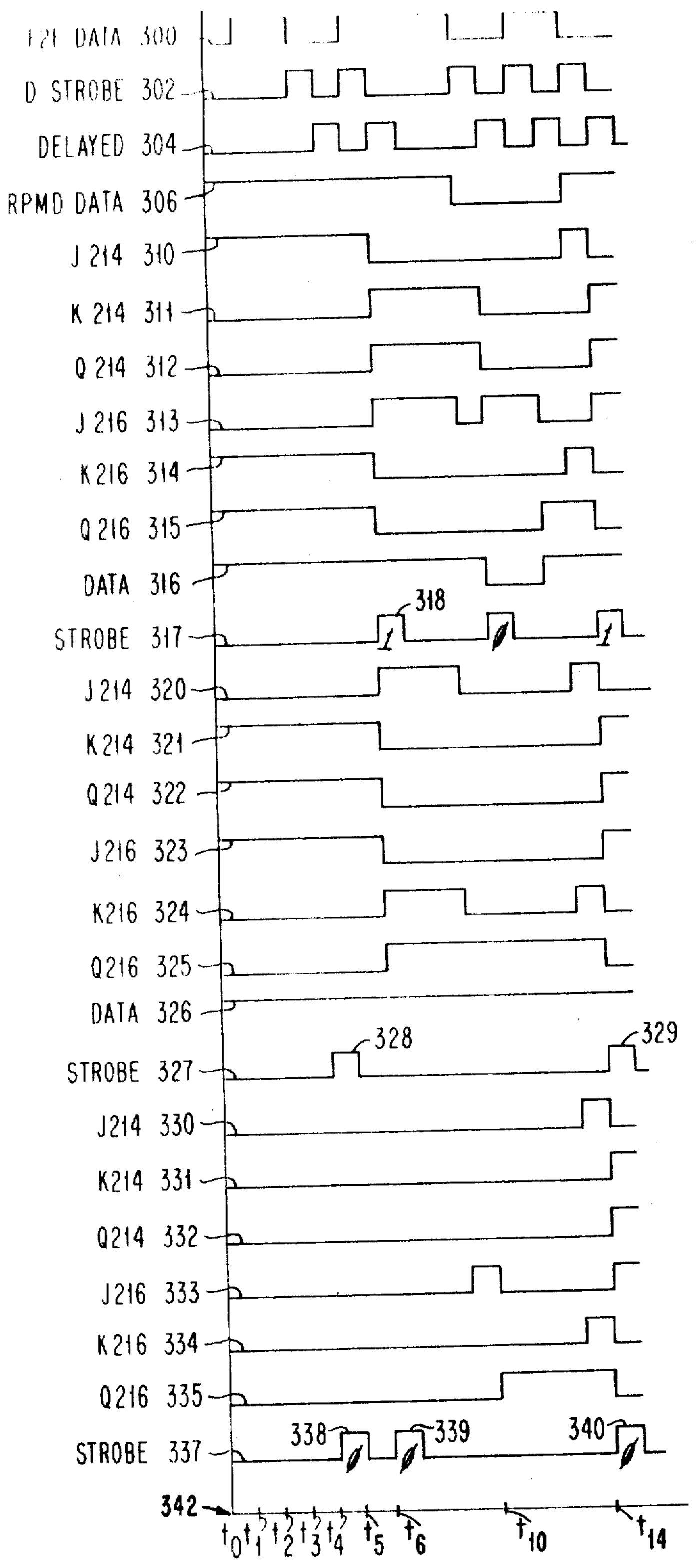

FIG. 11 is a graphical representation of waveforms illustrating the synchronization and/or resynchronization of the translating circuit according to the invention. A curve 300 represents an F2F data wave for the data stream 1$\phi$1. The corresponding RPMD strobe pulse wave is depicted by a curve 302 and another curve 304 represents the same wave delayed in time. The RPMD data wave is represented by a curve 306. The synchronizing operation depends from three operating conditions. If at time $t_4$ the Q terminals of the flip-flip circuits 214 and 216 are $\phi$ and 1 respectively, the system is already synchronized. Curves 310–315 represent levels at terminals J, K, Q of flip-flop circuit 214 and J, K, Q of flip-flop circuit 216 respectively. The F2F output level at terminal 32'' is represented by a curve 316 and the F2F strobe pulse train by another curve 317, with the corresponding 1$\phi$1 output indicated on a line 318 at times $t_6$, $t_{10}$, and $t_{14}$.

If at time $t_4$ the Q terminals of the flip-flop circuits 214 and 216 are 1 and $\phi$ respectively, the system is out of synchronism. The terminals J, K and Q of the flip-flop circuits exhibit levels as represented by curves 320–325; the data is at a steady unit level as shown by the curve 326 and the strobe pulse line has but two pulses as shown by a curve 327. The pulse 328 at time $t_4$ is misaligned with the first strobe pulse at time $t_6$ in curve 317 and therefore is out of syncronism. The pulse 329 at the time $t_{14}$ is in proper alignment and the system is now in synchronism. If the Q terminals of both flip-flop circuits are at $\phi$ level the system requires synchronizing. The curves 330-335 show the levels for the terminals listed for the other unsynchronized situation for this condition. The data level is again erroneous for the first part of a curve 336 and the strobe pulses as shown in a curve 337 are likewise in error. The pulses 338 and 339 at times $t_4$ and $t_6$ are out of alignment but at time $t_{14}$ the pulse 340 is aligned and the system is in synchronism ready for translating.

After the flip-flop circuits 214 and 216 have been reset at the start of the scanning operation, the Q terminals cannot both rise to the 1 level, and hence this situation cannot be considered as one of the possible initial states.

Those skilled in the art will readily see that the same result will obtain where one or more RPMD $\phi$ bits precede an F2F1 bit.

Figure 12:
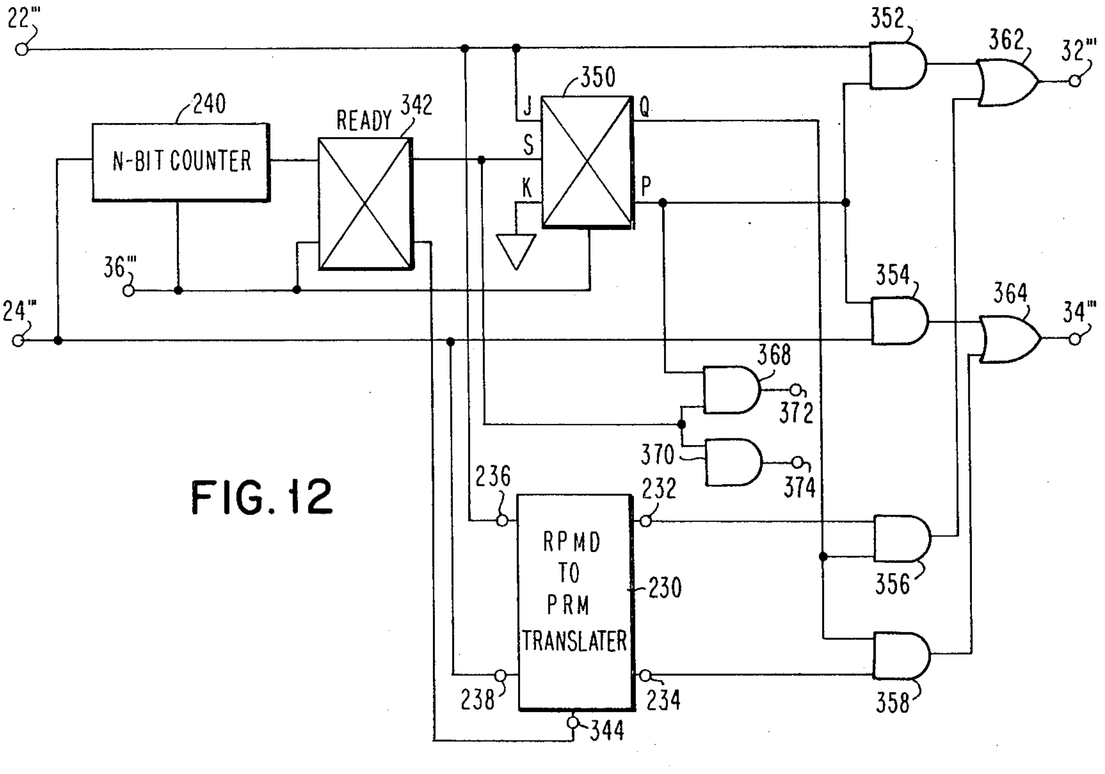
FIG. 12 is a functional diagram of circuitry automatically adaptable to RPM and PRM coding according to the invention.

As mentioned hereinbefore, the invention is primarily concerned with a translating circuit for adapting a PRM demodulating circuit to the demodulating of data recorded in PRM form. Obviously, a simple electromechanical switching arrangement is effective to interconnect the circuitry for decoding RPM data in the usual form and adding the translating circuit for decoding PRM coded data. As stated earlier, the SOM characters are coded with leading naught bits for both F2F and RPM data. The F2F naught bits are interpreted as RPM unit bits by the RPM demodulator, and therefore, the two codes initially appear as different binary values at the output terminals of the RPM demodulating circuitry and these are recognized by the circuitry following the demodulator. A functional circuit arrangement for automatically determining which of the two codings have been employed, and for switching the circuitry in order to produce the desired demodulated data at the output terminals, is shown in the functional diagram of FIG. 12. In this diagram, the output of the RPM demodulating circuit is applied to the data input terminals 22''' and the strobe pulse input terminals 24''' and the corresponding output data will appear at the terminals 32''' as sampled by strobe pulses delivered at the terminals 34'''. An RPMD-to-PRM translater 230 is arranged in accordance with the teachings of the invention as hereinbefore set forth. Binary data levels appear at output terminals 232 as sampled by strobe pulses at terminals 234 in response to input data at terminals 236 which are connected to the terminals 22''', and the application of RPMD strobe pulses at terminals 238, which are connected to the terminal 24'''. The initializing circuitry is omitted from the circuit 230 or alternately provisions are made to take output from the ready latch for application as will be described with respect to the specific arrangement shown. Here an N-bit counter 240 and a ready flip-flop circuit 342 of the types discussed hereinbefore are connected as shown, and held in the reset condition by a reset potential level at terminals 36'''. The reset potential output line of the ready flip-flop circuit 342 is connected to the reset input terminals 344 of the circuit 230 as hereinbefore described. The ready latch 342 is connected to a code detection switch shown here as a J-K flip-flop circuit 350. The J terminal is connected to the data input terminals 22''', and the K terminal is connected to a point of reference potential. The strobe or set terminal of the J-K flip-flop circuit 350 is connected to the erect output terminal of the ready latch 342 for strobing the J-K flip-flop circuit 350 on the Nth count of the counter 240. The Nth count is quite frequently "8" in conventional apparatus, but it may be any other number as desired. At the Nth count, RPM coded data will be a binary naught. With this binary naught applied at the J terminal of the J-K flip-flop circuit 350, and a strobe pulse applied, the P terminal of the circuit 350 will remain up or come up, if it were down, for enabling AND gating circuits 352 and 354, which circuits effectively bypass the translating circuit 230. When PRM data is being decoded by an RPM demodulator, the data bit appearing at the input terminals 22''' for application to the J terminal of the J flip-flop circuit 350 will be a binary "1" at the Nth bit. With the binary "1" still applied, the detector circuit 350 is strobed and the Q terminal will come up enabling AND gating circuits 356 and 358; the P terminal of course drops, disabling the AND gating circuits 352 and 354. Thus, the translater circuit 230 is automatically switched into the circuit OR gating circuits 362 and 364. Thus, the data levels and strobe pulses from the AND gating circuits to the output terminals 32''' and 34''', respectively. This circuit functions without conscious knowledge of the operator and delivers the intended data to the utilization apparatus without any indication of the original coding. Frequently, however, an indication of the source coding is desired. This is accomplished readily by a pair of AND gating circuits 368 and 370, which are connected to the Q and P terminals of the coding detector circuit 350, respectively, and enabled by the output of the ready latch 342 for delivering an indication of RPM data at the terminals 372 and alternately an indication of PRM data at the terminal 374 at levels for driving suitable indicating apparatus as desired.

While the invention has been shown and described particularly with reference to the preferred embodiments thereof, and various alternatives have been suggested, it should be understood that those skilled in the art may effect still further changes without departing from the spirit and scope of the invention as defined hereinafter.

The invention claimed is:

1. Logical circuitry for recovering pulse rate modulation recorded data from the output of retrospective pulse modulation decoding apparatus used in recovering said recorded data, comprising a data input terminal and a strobe input terminal to which data and strobe outputs of said decoding apparatus are applied;

a data output terminal and a strobe output terminal to which pulse rate modulation data and strobe information are delivered;

a plurality of bistable flip-flop circuits each having input, output and resetting potential terminals;

at least one logical gating circuit having one input terminal connected to one of said output terminal of one of said flip-flop circuits, at least one other input terminal to which data information is applied and an output terminal connected to the first said data output terminal;

a plurality of logical gating circuits having one input terminal of one gating circuit coupled to the first said strobe input terminal one input terminal of another logical gating circuit, the remaining input terminals of said plurality of logical gating circuits being coupled to said flip-flop and said logical gating circuits, and the output terminal of one of said plurality of logical gating circuits being connected to said strobe output terminals; and a counting circuit having an input terminal connected to said strobe input terminal and having an output terminal, a latching circuit having an input terminal connected to the output terminal of said counting circuit and an output terminal connected to one of said flip-flop circuits for reciprocating the latter at a predetermined count of said counting circuit.

2. Logical circuitry for recovering pulse rate modulation recorded data from the output of retrospective pulse modulation decoding apparatus, used in scanning said recorded data, comprising a data input terminal and a strobe input terminal to which data and strobe outputs of said decoding apparatus are applied, a data output terminal and a strobe output terminal to which pulse rate modulation data and strobe information are delivered, four bistable flip-flop circuits each having set and reset input terminals and an output terminal, a strobe pegging flip-flop circuit having two complementary input terminals, an output terminal and circuitry coupling said output terminal to said strobe output terminal, a counting circuit having an input terminal coupled to said strobe input terminal and a carry terminal coupled to the set terminal of a first of said flip-flop circuits, a two-bit binary shift register having a data terminal connected to said data input terminal, a shift terminal connected to said strobe input terminal, and four binary output terminals, two data AND gating circuits each having an input terminal individually connected to said output terminals of a second and a third of said flip-flop circuits, two other input terminals connected to binary output terminals of said shift register, and output terminals coupled to said data output terminal, one interchange AND gating circuit having one input terminal connected to the output terminal of the first said flip-flop circuit, another input terminal connected to one of the binary output terminals of said shift register, and an output terminal connected to the reset terminal of the first said flip-flop circuit, to the set terminal of the second said flip-flop circuit and to one of said complementary input terminals of said strobe pegging flip-flop circuit, a second interchange AND gating circuit having one input terminal coupled to the other terminal of the first of said data AND gating terminal, another input terminal connected to one of the binary output terminals of said shift register, and an output terminal connected to the reset terminal of said second flip-flop circuits, to the set terminal of the third of said flip-flop circuits and coupled to said one complementary input terminal of said strobe pegging flip-flop circuit to which the first said interchange AND gating circuit is coupled, a third interchange AND gating circuit having one input terminal coupled to the output terminal of the other of said data AND gating circuits, another input terminal connected to one of the binary output terminals of said shift register, and an output terminal connected to the reset terminal of said third flip-flop circuit and to the set terminal of the fourth of said flip-flop circuits and coupled to the other of said complementary input terminals of said strobe pegging flip-flop circuit, at least a fourth interchange AND gating circuit having one input terminal coupled to the output terminal of the fourth of said bistable flip-flop circuits, another input terminal connected to one of said binary output terminals of said shift register, and having an output terminal connected to the reset terminal of said fourth flip-flop circuit, the set terminal of said first flip-flop circuit and to one of said complementary input terminals of said strobe pegging flip-flop circuit, and said coupling circuit having an input lead connected to the first said strobe terminal.

3. Logical circuitry as defined in claim 2 and incorporating a time delay circuit interposed in said input lead of said coupling circuitry.

4. Logical circuitry as defined in claim 2 and wherein said coupling circuitry comprises an additional AND gating circuit having one input terminal connected to the output terminal of said strobe pegging circuit, another input terminal, and an output terminal coupled to said strobe output terminal, and a time delay circuit connected between said strobe input terminal and said other terminal of said additional AND gating circuit.

5. Logical circuitry as defined in claim 4 and wherein said coupling circuitry further comprises an input terminal connected to said time delay circuit and an output terminal, a further AND gating circuit having an input terminal connected to the output terminal of said binary flip-flop circuit, another input circuit connected to said time delay circuit and having an output circuit coupled to said strobe output terminal.

6. Logical circuitry as defined in claim 4 and incorporating an actuate indicating current input terminal, actuate current responsive circuitry for generating reset potential, and connections between said generating circuitry and the reset terminals of all of said flip-flop circuits.

7. Logical circuitry as defined in claim 5 and wherein said binary flip-flop circuit has a reset terminal connected to the output terminal of said strobe pegging flip-flop circuit.

8. Logical circuitry as defined in claim 6 and incorporating a ready flip-flop circuit having a set terminal connected to said generating circuitry, a reset terminal connected to the output terminal of said counting circuit, and an output circuit, and an AND gating circuit having one input terminal connected to the output terminal of said ready flip-flop circuit, another input terminal connected to said strobe input terminal and an output terminal connected to the input terminal of said counting circuit.

9. Logical circuitry for recovering pulse rate modulation recorded data from the output of retrospective pulse modulation decoding apparatus, used in scanning said recorded data, comprising a data input terminal and a strobe input terminal to which data and strobe outputs of said decoding apparatus are applied, a data output terminal and a strobe output terminal to which pulse rate modulation data and strobe information are delivered, an XOR gating circuit having an input terminal connected to said data input terminal, one other input terminal, and an output terminal, an AND gating circuit having one input terminal connected to the output terminal of said XOR gating circuit, one other input terminal, and an output terminal one J-K flip-flop circuit having a J terminal connected to said output terminal of said AND gating circuit, a K terminal, a P terminal connected to said other input terminal of said AND gating circuit, a Q terminal, a resetting potential terminal, and a triggering terminal connected to said strobe input terminal, another J-K flip-flop circuit having a J terminal connected to said K terminal of said one J-K flip-flop circuit, a K terminal, a Q terminal connected to said K terminal, a P terminal, a resetting potential terminal, and a triggering terminal connected in common with said triggering terminal of said one flip-flop circuit to said strobe input terminal, an electric connection between said Q terminal of said one flip-flop circuit and the interconnected K and J terminals of said one and said other flip-flop circuits, one OR gating circuit coupling said Q terminals of said J-K flip-flop circuits to said data output terminal, another OR gating circuit coupling said P terminal and said Q terminal of said one, and said other flip-flop circuits to the output terminal of the OR gating circuit itself, another AND gating circuit having one input terminal connected to said output terminal of said other OR gating circuit, or other input terminal and an output terminal connected to said strobe output terminal, and an electric lead coupling said other input terminal of said other AND gating circuit to said strobe input terminal.

10. Logical circuitry as defined in claim 9 and incorporating a time delay device interposed in said electric lead.

11. Logical circuitry as defined in claim 9 and wherein said time delay device is arranged to delay the application of strobe to said other AND gating circuit until the triggering of said flip-flop circuits by that strobe is completed.

12. Logical circuitry as defined in claim 9 and wherein said electric connection is a low impedance direct connection.

13. Logical circuitry as defined in claim 9 and wherein said electric connection comprises a further AND gating circuit having one input terminal connected to said Q terminal of said one J-K flip-flop circuit, an output terminal connected to said interconnected K and J terminals, another input terminal connected to said P terminal of said other J-K flip-flop circuit, and a further input terminal connected to said data input terminal.

14. Logical circuitry as defined in claim 9 and incorporating a counting circuit having an input terminal connected to said strobe input terminal and a carry output current delivering terminal, and an electric switching circuit connected to said carry output terminal and to said resetting terminals of said J-K flip-flop circuits and arranged for applying resetting potential to said flip-flop circuits and arranged for removing said potential selectively in response to said carry output current.

15. Logical circuitry as defined in claim 9 and incorporating an electronic selecting switch for automatically connecting the recovering circuitry, a selected data output terminal and a selected strobe output terminal to which demodulated data and strobe information are delivered, one pair of AND gating circuits having output terminals individually coupled to said selected data and selected strobe information output terminals, input terminals connected in common, and input terminals connected individually to said data and said strobe input terminals, another pair of AND gating circuits having output terminals individually coupled to said selected data and selected strobe information output terminals, input terminals connected individually to the first said data and strobe output terminals, and input terminals connected in common, a bistable flip-flop circuit having erect and inverted output terminals individually connected to said input terminals connected in common of said pairs of AND gating circuits for enabling but one pair at a time, and having an input terminal connected to the first said data input terminal, and having another terminal, an electric switching circuit coupled to said other terminal of said bistable flip-flop circuit in response to strobe and data information.

16. Logical circuitry as defined in claim 15 and wherein said electric switching circuit comprises an N-bit counting circuit having an input connected to the first said strobe input terminal and a carry terminal for producing carry current on the Nth bit count, another bistable flip-flop circuit having an input terminal connected to said carry terminal of said counter and an output terminal connected to said other bistable flip-flop circuit for enabling the latter at the Nth bit count.

17. Logical circuitry as defined in claim 15 and wherein said electronic selecting switch comprises a further J-K flip-flop circuit having a J terminal connected to the first said data input terminal, a K terminal connected to a point of fixed reference potential, Q and P terminals individually connected to said interconnected pairs of AND gating circuits, a resetting potential terminal, and a triggering terminal, a bilateral flip-flop circuit having an output terminal connected to said triggering terminal of said further J-K flip-flop circuit and having an input terminal, and a counting circuit having a carry current terminal connected to said input terminal of said bilateral flip-flop circuit and having an input terminal connected to the first said strobe input terminal thereby to trigger said further J-K flip-flop circuit at carry current of said circuit.

18. Logical circuitry as defined in claim 9 and wherein said electric connection comprises an automatic synchronizing circuit including a three level coincidence circuit having input terminals connected to output terminals of said flip-flop circuits and connected to said data input terminal and having an output terminal connected to said J and K terminals of said J-K flip-flop circuits.

* * * * *

0-1050
5/69)

UNITED STATES PATENT OFFICE
CERTIFICATE OF CORRECTION

Patent No. 3,848,251 Dated November 12, 1974

Inventor(s) Dwight George Allmon, Charles Walter Coker, Jr. & Pedro Lee

It is certified that error appears in the above-identified patent and that said Letters Patent are hereby corrected as shown below:

In the drawing, FIGS. 2, 3, 4, 5, 8, 9, 10, 11 and 12 should appear as shown on the attached sheets.

Signed and sealed this 4th day of March 1975.

(SEAL)
Attest:

RUTH C. MASON
Attesting Officer

C. MARSHALL DANN
Commissioner of Patents
and Trademarks